United States Patent
Nakajima et al.

(10) Patent No.: US 6,242,290 B1
(45) Date of Patent: *Jun. 5, 2001

(54) METHOD OF FORMING A TFT BY ADDING A METAL TO A SILICON FILM PROMOTING CRYSTALLIZATION, FORMING A MASK, FORMING ANOTHER SILICON LAYER WITH GROUP XV ELEMENTS, AND GETTERING THE METAL THROUGH OPENING IN THE MASK

(75) Inventors: Setsuo Nakajima; Hisashi Ohtani, both of Kanagawa (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/114,223

(22) Filed: Jul. 13, 1998

(30) Foreign Application Priority Data

Jul. 14, 1997 (JP) .................................................. 9-205345

(51) Int. Cl.[7] .................................................. H01L 21/00
(52) U.S. Cl. .......................... 438/153; 438/143; 438/154
(58) Field of Search .................................. 438/143, 149, 438/153, 154

(56) References Cited

U.S. PATENT DOCUMENTS

| | | | |
|---|---|---|---|
| 4,561,171 | 12/1985 | Schlosser | 438/56 |
| 5,085,711 | 2/1992 | Iwamoto et al. | 136/258 |
| 5,244,819 | 9/1993 | Yue | 438/402 |
| 5,275,851 | 1/1994 | Fonash et al. | 438/479 |
| 5,380,372 | 1/1995 | Campe et al. | 136/258 |
| 5,403,772 | 4/1995 | Zhang et al. | 438/166 |
| 5,426,061 | 6/1995 | Sopori | 438/475 |
| 5,605,847 | * 2/1997 | Zhang | 438/164 |
| 5,608,232 | 3/1997 | Yamazaki et al. | 257/66 |
| 5,616,507 | * 4/1997 | Nakai | 438/480 |
| 5,700,333 | * 12/1997 | Yamazaki | 136/258 |
| 5,736,420 | * 4/1998 | Min et al. | 438/143 |
| 5,830,784 | * 11/1998 | Zhang et al. | 438/154 |
| 5,843,225 | 12/1998 | Takayama et al. | 117/8 |
| 5,915,174 | 6/1999 | Yamazaki et al. | 438/166 |
| 5,961,743 | 10/1999 | Yamazaki et al. | 136/258 |
| 5,962,871 | * 10/1999 | Zhang et al. | 257/66 |
| 5,977,559 | 11/1999 | Zhang et al. | 257/57 |

FOREIGN PATENT DOCUMENTS 6-268212  9/1994 (JP) .

* cited by examiner

Primary Examiner—Charles Bowers
Assistant Examiner—William M. Brewster
(74) Attorney, Agent, or Firm—Eric J. Robinson; Nixon Peabody LLP

(57) ABSTRACT

There is disclosed a method of fabricating TFTs using a silicon film crystallized with the aid of nickel. The nickel is removed from the crystallized silicon film. The method starts with maintaining nickel in contact with the surface of an amorphous silicon film. Then, a heat treatment is performed to form a crystalline silicon film. At this time, nickel promotes the crystallization greatly, and nickel diffuses into the film. A mask is formed. A silicon film heavily doped with phosphorus is formed. Thereafter, a heat treatment is performed to move the nickel from the crystalline silicon film into the phosphorus-rich silicon film. This reduces the concentration of nickel in the crystalline silicon film.

44 Claims, 6 Drawing Sheets

METHOD OF FORMING A TFT BY ADDING A METAL TO A SILICON FILM PROMOTING CRYSTALLIZATION, FORMING A MASK, FORMING ANOTHER SILICON LAYER WITH GROUP XV ELEMENTS, AND GETTERING THE METAL THROUGH OPENING IN THE MASK

FIELD OF THE INVENTION

The present invention relates to a method of fabricating a thin-film transistor using a crystalline silicon film.

DESCRIPTION OF THE PRIOR ART

Thin-film transistors (TFTs) having an active layer made of a thin film of silicon are known. These TFTs are chiefly put into practical use in active-matrix liquid crystal displays.

TFTs currently made practicable are classified into amorphous silicon TFTs (a-Si TFTs) using amorphous silicon film and high-temperature p-Si TFTs fabricated using ordinary IC technology.

High-temperature p-Si is obtained by making use of a technology for obtaining a crystalline silicon film by utilizing a high-temperature treatment performed over 900° C. Where high characteristics are required, it is desired to use a crystalline silicon film. At the heat treatment temperature necessary for manufacturing high-temperature p-Si film, however, it is impossible to use a glass substrate.

TFTs are mainly used in LCDs and demand the use of glass substrates. In an attempt to satisfy this requirement, research has been conducted into a technique for fabricating a crystalline silicon film by process steps performed at low temperatures that glass substrates can withstand. These processes are known as low-temperature processes in contrast to high-temperature processes for fabricating high-temperature p-Si. Crystalline silicon film fabricated by such low-temperature processes are known as low-temperature p-Si, and TFTs using low-temperature p-Si film are termed low-temperature p-Si TFTs.

Techniques for fabricating low-temperature p-Si films can be roughly classified into a method using laser irradiation and a method using heating. The method using laser irradiation is characterized in that it hardly thermally damages a glass substrate because the laser light is directly absorbed near the surface of an amorphous silicon film. However, the stability of the used laser presents problems. In addition, this method cannot cope with large-area films satisfactorily.

On the other hand, with respect to the method using heating, the required crystalline silicon film cannot be obtained by a heat treatment performed at a temperature to which a glass substrate can stand up.

We have proposed a technique for alleviating the existing problems described above in Japanese Unexamined Patent Publication No. 268212/1994. In this technique, a metallic element for promoting crystallization of silicon, typified by nickel, is maintained in contact with the surface of an amorphous silicon film. Then, a heat treatment is performed. Thus, a crystalline silicon film having the requisite crystallinity can be formed at a temperature which is lower than the temperature used heretofore and to which the glass substrate and stand up. This crystallization technique using nickel is useful in that a crystalline silicon film having the required crystallinity can be obtained by a heat treatment conducted at a temperature low enough that the glass substrate can withstand.

However, the nickel used for the crystallization inevitably remains in the active layer. This leads to instability of the characteristics of the finished TFTs and to deterioration of the reliability.

SUMMARY OF THE INVENTION

It is an object of the present invention to provide a method of forming a crystalline silicon film, using the aforementioned metallic element for promoting crystallization of silicon, in such a way as to eliminate the effects of nickel remaining in the obtained silicon film.

One embodiment of the present invention is illustrated in a process sequence of FIG. 1 and comprises the steps of: forming a silicon film 104 crystallized by the action of a metallic element (such as nickel) for promoting crystallization of silicon; forming a mask 105 for exposing parts of the silicon film; forming a film 106 containing a XV group (group 15) element (such as phosphorus) to cover parts of the exposed silicon film 104 and the mask 105; and performing a heat treatment (FIG. 1(D)) to move the metallic element from the silicon film 104 to the film 106 containing the XV group (group 15) element.

In the structure described above, as for the nickel moved by the heat treatment, the silicon films 104 and 106 are joined together. That is, the nickel moved by the heat treatment cannot distinguish between the silicon films 104 and 106.

Accordingly, in the heat treatment step shown in FIG. 1(D), the nickel element contained in the silicon film 104 diffuses into the silicon film 106. Note that the metallic element hardly diffuses into the mask 105 consisting of a silicon oxide film.

On the other hand, the silicon film 106 is heavily doped with phosphorus and serves as gettering sites for nickel. Therefore, the nickel moved into the silicon film 106 bonds with phosphorus and becomes stable.

If the heat treatment temperature used in the step of FIG. 1(D) is set lower than 800° C., preferably lower than 750° C., phosphorus hardly diffuses through the silicon film and so nickel once accepted into the silicon film 106 stops there. The nickel does not diffuse back into the silicon film 104.

In this way, the nickel in the silicon film 104 moves into the silicon film 106. It can be said that the nickel in the silicon film 104 is gettered and driven into the silicon film 106.

During the heat treatment shown in FIG. 1(D), the whole silicon film 106 acts as gettering sites. Therefore, even if the area of the portion of the silicon film 104 in contact with the silicon film 106 is relatively small, movement of the nickel can be made effectively. That is, the concentration of nickel in the silicon film 104 can be effectively reduced.

Another embodiment of the invention is illustrated in FIGS. 3(A)–3(E) and comprises the steps of: forming a mask 302 on an amorphous silicon film 301 and exposing parts of the mask by openings 303 formed in the mask; selectively introducing a metallic element for promoting crystallization of silicon into the exposed regions of the amorphous silicon film (FIG. 3(B)); performing a heat treatment to diffuse the metallic element from the exposed regions into the silicon film (FIG. 3(C)); forming a silicon film 307 containing phosphorus on the mask 302 and bringing the phosphorus-containing silicon film into contact with the metal-diffused silicon film in the exposed regions (FIG. 3(D)); and performing a heat treatment to move the metallic element from the metal-diffused silicon film into the phosphorus-doped film via the exposed regions as indicated by the arrow 308 (FIG. 3(D)).

Where the method described above is adopted, nickel can be removed from the region in which the metallic element has been introduced (the region having the openings 303), by making use of the mask 302 used to induce crystal growth, known as lateral growth, as shown in FIG. 3(C). The same mask pattern can be used both for the introduction of the metallic element and for the removal of the metallic element. Consequently, the process sequence is not complicated so much.

During the nickel-removing step shown in FIG. 3(D), the silicon film 307 is far larger in area than the openings 303. When the nickel is diffusing into the silicon film 307, the nickel is effectively gettered out of the openings 303 in the mask and driven into the silicon film 307.

Nickel is the most preferred metallic element for promoting crystallization of silicon. Use of phosphorus (P) is more preferable as the XV group (group 15) element. Where a combination of nickel and phosphorus is used, the present invention yields the best advantages.

One or more elements selected from the group consisting of Fe, Co, Ni, Ru, Rh, Pd, Os, Ir, Pt, Cu, Au, Ge, Pb, and In can be employed as the metallic element for accelerating crystallization of silicon. Any one element P, As, or Sb can be selected as the XV group (group 15) element.

Other objects and features of the invention will appear in the course of the description thereof, which follows.

DETAILED DESCRIPTION OF THE INVENTION

Figure 1A:
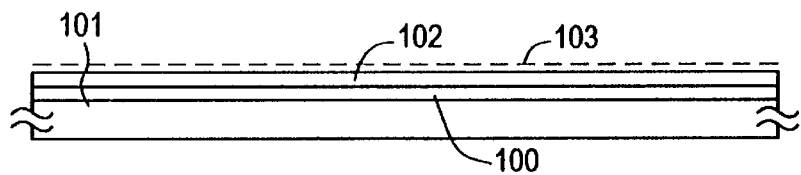
FIGS. 1(A)–1(E) and 2(A)–2(E) are cross-sectional views of a TFT, illustrating a process sequence for fabricating the TFT in accordance with the present invention.

An embodiment of the present invention is illustrated in FIGS. 1(A)–1(E), where nickel is maintained in contact with the surface of an amorphous silicon film as indicated by 103. Then, a heat treatment is performed at 600° C. for 8 hours to crystallize an amorphous silicon film 102. In this way, a crystalline silicon film 104 is obtained.

Where a solution is used, Ni can be easily introduced. Furthermore, the amount of the introduced nickel can be readily adjusted. Besides the method using a solution, various methods such as CVD, sputtering, evaporation, gas adsorption, and ion implantation can be used. Whatever method can be adopted to introduce nickel, as long as nickel is maintained in contact with the surface of the amorphous silicon film or nickel is present inside the amorphous silicon film. The same theory applies to cases where a metallic element other than nickel is used.

Then, a mask 105 consisting of a silicon oxide film is formed. Thereafter, an amorphous silicon film 106 heavily doped with phosphorus is formed. Then, a heat treatment is carried out to getter the nickel in the crystalline silicon film 104 and to drive it into the amorphous silicon film 106.

In the present invention, the film 104 where the nickel is gettered and the film 106 accepting the gettered nickel are made of the same silicon film. Consequently, nickel can effectively move. That is, nickel can be effectively gettered.

EXAMPLE 1

In the present example, an N-channel TFT is manufactured. First, a silicon oxide film 100 is formed as a buffer layer on a glass substrate 101 to a thickness of 300 nm by plasma-assisted CVD (FIG. 1(A)). In this example, a Corning 1737 glass substrate having a strain point of 667° C. is used as the glass substrate.

Then, an amorphous silicon film 102 is formed to a thickness of 50 nm by plasma-assisted CVD. LPCVD is the best method of forming an amorphous silicon film. In this example, plasma-assisted CVD producing a high yield is utilized.

Thereafter, a nickel acetate solution whose concentration is adjusted to 10 ppm by weight is applied. In this way, nickel is kept in contact with the surface as indicated by 103.

Figure 1B:
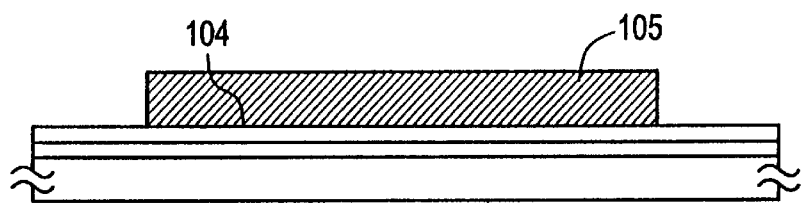

The resulting state is shown in FIG. 1(A). This is followed by formation of a mask 105 made of a silicon oxide film as shown in FIG. 1(B). The thickness of the silicon oxide film forming the mask 105 is 250 nm. The mask 105 can be made of silicon nitride or silicon oxynitride.

An amorphous silicon film 106 heavily doped with phosphorus is formed by plasma-assisted CVD. In this example, a source gas consisting of 97% by volume of silane and 3% by volume of phosphine is used, and the amorphous silicon film 106 is grown to a thickness of 150 nm. This film may be formed by LPCVD. Alternatively, the film may be formed of crystallites under appropriate film growth conditions.

Phosphorus is introduced under such conditions that the concentration of phosphorus in the formed amorphous silicon film is more than $1 \times 10^{19}$ atoms/cm$^3$, preferably more than $5 \times 10^{19}$ atoms/cm$^3$. Consequently, nickel will be gettered later.

Figure 1C:
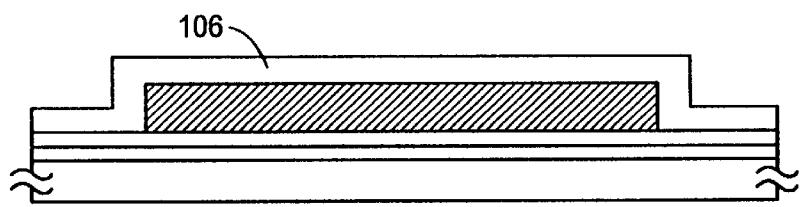
Figure 1D:
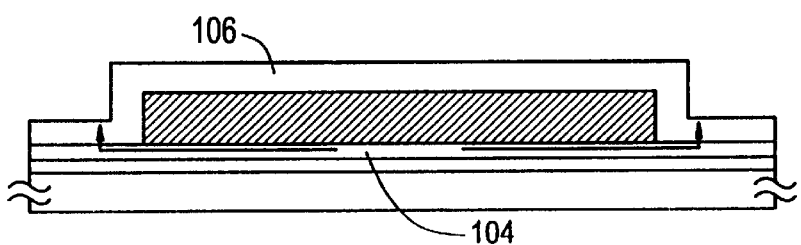

After forming the amorphous silicon film 106 as shown in FIG. 1(C), a heat treatment is performed. In this example, the heat treatment is carried out at 600° C. for 8 hours by a heating furnace of the resistively heating type. Alternatively, the heating may be done by irradiation of intense light such as infrared light emitted by a xenon lamp. During this process step, nickel moves from the crystalline silicon film 104 into the amorphous silicon film 106 as indicated by the arrow of FIG. 1(D). This is enabled where a quite thin oxide film (approximately less than 10 nm thick) or a native oxide film is formed on the surface of the crystalline silicon film 104, because nickel diffuses through the silicon film very rapidly and because phosphorus and nickel are bonded together in various forms very stably.

The heating temperature is selected from the range of from 450° C. to 750°0 C., which is substantially limited by the strain point of the glass substrate. To enhance the gettering effect, it is desired to set the temperature higher.

If the heat treatment temperature is lower than the above-described range, the diffusive velocity and the diffusion distance of nickel are insufficient and so sufficient gettering effect is not obtained. On the other hand, if the heat treatment temperature is higher than the above-described range, the diffusive velocity and the diffusion distance of nickel are sufficiently high. However, the diffusion of phosphorus cannot be neglected. In consequence, it is not possible to concentrate nickel in certain regions.

Heat treatment shown in FIG. 1(D) getters the nickel and drives it into the amorphous silicon film 106. As a result, the amorphous silicon film 106 is heavily doped with nickel.

Then, the nickel-rich amorphous silicon film 106 is etched away. At this time, the crystalline silicon film 104 not covered with the mask 105 of the silicon oxide film is also removed (FIG. 1(E)).

In this way, a crystalline silicon film pattern 107 is formed. The crystallization is carried out by once diffusing nickel into the film. Then, the nickel is removed from the film during the step of FIG. 1(D).

Figure 2A:
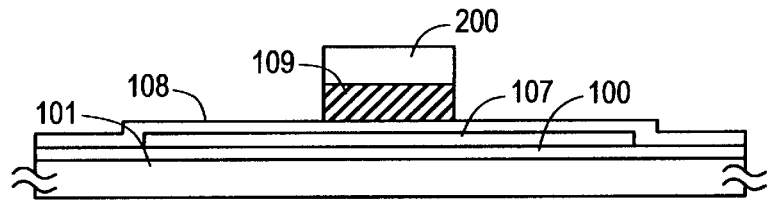

Then, the mask 105 consisting of the silicon oxide film is removed. Then, as shown in FIG. 2(A), a silicon oxide film 108 is formed to a thickness of 120 nm by plasma-assisted CVD. This silicon oxide film 108 acts as a gate insulator film.

An aluminum film (not shown) for forming gate electrodes is formed to a thickness of 400 nm by sputtering. This aluminum film is built up using a target containing 0.18% by weight of scandium. The inclusion of the scandium in the aluminum film suppresses formation of hillocks and whiskers that are needle-like protrusions produced by overgrowth of aluminum in later process steps.

Then, the aluminum film (not shown) is patterned, using a resist mask 200 to form a pattern 109 (FIG. 2(A)). Subsequently, an anodization step is performed using the aluminum pattern 109 as an anode while leaving the resist mask 200. During this step, an aqueous solution containing 3% by volume of oxalic acid is used as an electrolyte. The aluminum pattern is used as an anode. A cathode made of platinum is used. An electrical current is passed between both electrodes. In this way, an anodic oxide film 111 is formed.

This process step is carried out with the resist mask 200 left behind. Therefore, the anodic oxide film 111 is formed on the side surfaces of the aluminum pattern 109. The left aluminum film pattern is indicated by 110.

In the present embodiment, the anodic oxide film 111 grows a distance of 400 nm. This formed anodic oxide film 111 is porous in character.

After forming the anodic oxide film 111, the resist mask 200 is removed. Anodic oxidation is again performed. During this process step, an electrolyte prepared by neutralizing an ethylene glycol solution containing 3% by volume of tartaric acid with aqueous ammonia is used.

Figure 2B:
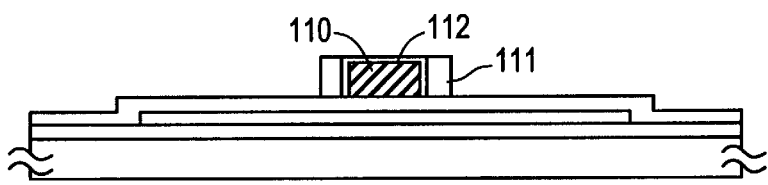

Since the electrolyte enters the porous anodic oxide film 111, an anodic oxide film 112 is formed. That is, the anodic oxide film 112 is formed on the surface of the aluminum pattern 110. This anodic oxide film 112 is 70 nm thick and dense. In this way, a state shown in FIG. 2(B) is obtained. The remaining aluminum pattern 110 forms the gate electrode of a TFT.

Then, the exposed silicon oxide film 108 is removed, using the gate electrode 110 and the denser anodic oxide film 112 surrounding the gate electrode 110 as a mask.

Figure 2C:
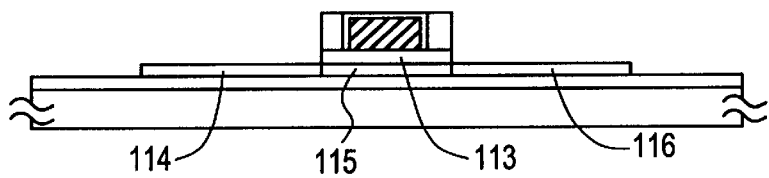

In this example, the exposed silicon oxide film 108 is etched away by a dry etch method (RIE) having vertical anisotropy. In this manner, a state as shown in FIG. 2(C) is obtained.

Thereafter, phosphorus is introduced by plasma doping. In particular, a source gas containing a dopant is changed into a plasma. Dopant ions are extracted from the plasma by an electric field. The extracted ions are accelerated by an electric field and injected into regions to be doped. Especially, the plasma doping refers to a method in which mass separation using a magnetic field is not carried out. On the other hand, a method in which mass separation is done as is often conducted in manufacture of ICs and the separated dopant ions are accelerated and injected is referred to as ion implantation.

The plasma doping has the advantage that it can cope with large areas. However, other elements such as hydrogen contained in the dopant gas are also introduced.

As a result, phosphorus is introduced into regions 114 and 116. For convenience, these doped regions are referred to as heavily doped regions. The regions 114 and 116 will become a source region and a drain region, respectively, later. This introduction may be done under normal conditions for forming source and drain regions. A region 113 is left undoped.

Figure 2D:
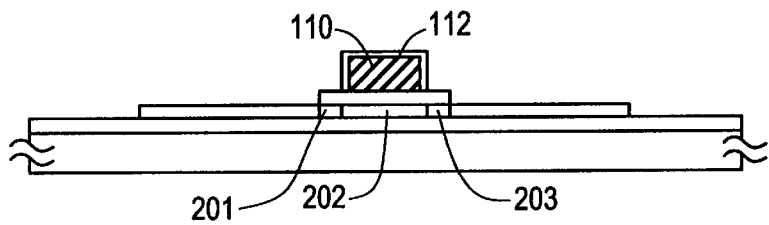

Then, the porous anodic oxide film 111 is removed as shown in FIG. 2(D). Phosphorus is again introduced by plasma doping at a lower dose than the doping step shown in FIG. 2(C). In this way, lightly doped regions 201 and 203 are formed in a self-aligned manner (FIG. 2(D)). An undoped region 202 is defined as a channel region (FIG. 2(D)).

Subsequently, excimer laser light is irradiated to activate the doped regions. This anneals out the damage to the doped regions caused by the doping. At the same time, the dopant in the doped regions is activated.

Highly resistive regions are formed adjacent to the channel region 202 with the same film thickness as the dense anodic oxide film 112. In the present embodiment, the anodic oxide film 112 is as small as 70 nm and so the presence of this anodic oxide film 112 is neglected.

Figure 2E:
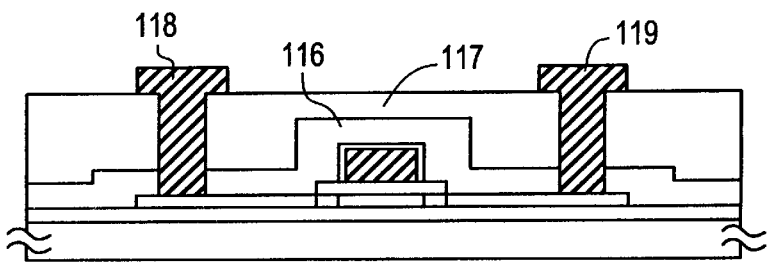

Then, as shown in FIG. 2(E), a silicon nitride film 116 is formed as an interlayer dielectric film to a thickness of 250 nm by plasma-assisted CVD. Acrylic resin is spin-coated as a film 117. The minimum film thickness of the acrylic resin film 117 is 700 nm.

A contact hole is formed, and source and drain regions 118 and 119, respectively, are formed. In this way, a TFT (thin-film transistor) as shown in FIG. 2(E) is completed.

In the present embodiment, the active layer 107 of the TFT can have high crystallinity by using nickel. At the same time, gettering is done as shown in FIG. 1(D) to greatly reduce the concentration of the nickel remaining in the active layer 107.

Crystallization by a heat treatment can be performed at a lower temperature than where no nickel is used conventionally. Therefore, an inexpensive glass substrate can be employed.

EXAMPLE 2

The process sequence of the present example is similar to the process sequence of Example 1 except that a P-channel TFT is manufactured. For this purpose, boron is introduced instead of phosphorus in the steps shown in FIGS. 2(C) and 2(D).

EXAMPLE 3

The process sequence of the present example is similar to the process sequence of Example 1 except that the gate electrode is made of a material other than aluminum. In this example, the gate electrode is made of tungsten silicide.

The gate electrode may be made of various silicides and various metals in addition to the tungsten silicide described above. Furthermore, a silicon material to which conductivity is imparted can be used as the material of the gate electrode. Moreover, the gate electrode may consist of a laminated structure of various conductive materials.

Generally, where aluminum is used, the electrode has the advantage that it exhibits a low resistance. However, the process temperature is limited. On the other hand, where other materials are used, higher resistances are obtained than where aluminum is used. However, higher heat-resistance is obtained. In addition, the process temperature can be elevated.

EXAMPLE 4

The process sequence of this example is similar to the process sequence of Example 1 except that a process step for removing a trace amount of nickel remaining in the channel region is added to the nickel-gettering step shown in FIG. 1(D).

Figure 1E:
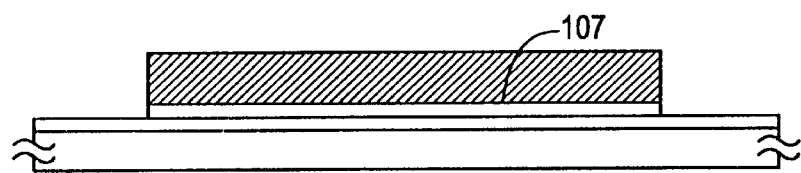

Execution of the nickel-gettering step shown in FIG. 1(D) lowers the nickel concentration in the region 107 shown in FIG. 1(E) to an unmeasurable level. More specifically, the nickel concentration measured immediately after the crystallization by SIMS (secondary ion mass spectroscopy) is approximately $1 \times 10^{18}$ atoms/cm$^3$ to $5 \times 10^{19}$ atoms/cm$^3$. This can be reduced to below $10^{17}$ atoms/cm$^3$ by performing the step shown in FIG. 1(D). That is, the concentration of the nickel remaining in the region 107 shown in FIG. 1(E) can be reduced to below $10^{17}$ atoms/cm$^3$. Accordingly, the concentration of nickel in the TFT manufactured by performing the process sequence of Example 1 can be lowered to below $10^{17}$ atoms/cm$^3$.

However, where less characteristic variations or higher reliability is required, the nickel concentration levels described above may pose problems. Our research has revealed that nickel present in the active layer (especially in the channel region and near the interfaces between the channel region and the doped regions) chiefly produces the adverse effects on the TFT characteristics.

Accordingly, in the present example, a contrivance is made to reduce the concentration of nickel remaining in the channel region. In this example, a heat treatment step is added to the process step shown in FIG. 2(D) during the process sequence of Example 1. This heat treatment is carried out at 450° C. for 2 hours. This getters the nickel remaining in the channel region 115 and drives the nickel into the highly doped regions 114 and 116 that are the source region 114 and the drain region 116, respectively. In particular, the concentration of nickel remaining in the channel region 115 decreases instead of increasing the concentration of nickel in the source region 114 and in the drain region 116.

This reduces the concentration of nickel remaining in the channel region and suppresses the adverse effect of the remaining nickel on the TFT characteristics.

Where the material of the gate electrode is changed to a silicide or other material showing higher resistance to heat, a heat treatment performed at a higher temperature produces desirable results. If the gate electrode is made of tungsten silicide, and if a heat treatment is performed at 600° C. for 2 hours, gettering is performed more effectively. The heat treatment may also be effected at the stage of FIG. 2(C).

Where the configuration of the present example is realized, it might be considered that nickel remaining in the source and drain regions produces adverse effects. However, the channel region undergoes neither change in the conductivity type nor resistance change, unlike the channel region. Therefore, the presence of nickel presents no problems.

EXAMPLE 5

In the present example, crystal growth different from the method of Example 1, especially the step shown in FIG. 1(A), is performed. The process sequence of this example is shown in FIGS. 3(A)–3(E). The process sequence of this example is similar to the process sequence of Example 1 after the active layer pattern for a TFT is obtained.

Figure 3A:
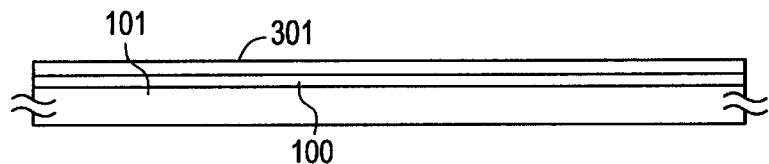
FIGS. 3(A)–3(E) are a cross-sectional view of another TFT, illustrating a process sequence for fabricating the TFT in accordance with the invention.

First, as shown in FIG. 3(A), a glass substrate 101 is prepared. A silicon oxide film 100 is deposited as a buffer layer to a thickness of 300 nm by plasma-assisted CVD. In this example, a Corning 1737 glass substrate is used as the substrate 101.

After forming the buffer layer 100, an amorphous silicon film 301 is formed. In this specific example, the amorphous silicon film 301 is deposited to a thickness of 50 nm by LPCVD. Then, a mask 302 made of a film of silicon oxide is formed. For this purpose, a silicon oxide film (not shown) is formed to a thickness of 120 nm by plasma-assisted CVD. This film is patterned, thus completing the mask 302 (FIG. 3(B)).

Then, a nickel acetate solution whose nickel concentration is adjusted to 10 ppm by weight is applied. Thus, nickel is maintained in contact with the exposed surface as indicated by 302 (FIG. 3(B)).

Thereafter, a heat treatment is performed at 600° C. for 8 hours in a nitrogen ambient. At this time, nickel diffuses into the amorphous silicon film 301 from the region with which nickel is in contact. Concomitantly, crystallization of the amorphous silicon film 301 progresses in the path as indicated by the arrow 305 (FIG. 3(C)).

In this way, a crystalline silicon film 306 having such peculiar crystal growth morphology is obtained. In particular, in this crystalline silicon film 306, crystals are grown parallel to the film surface from openings 303 in the mask in which nickel has been introduced. This crystal growth morphology is herein referred to as lateral growth. The region in which this crystal growth is done is referred to as the laterally grown region (FIG. 3(C)).

Figure 3B:
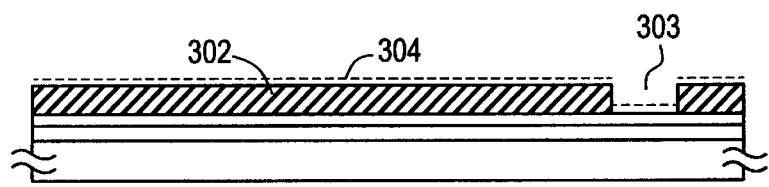
Figure 3C:
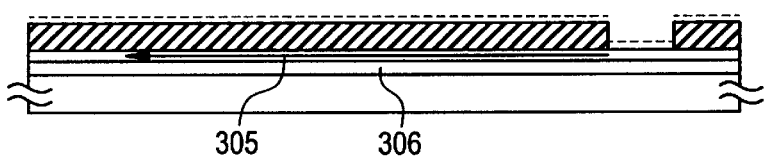
Figure 3D:
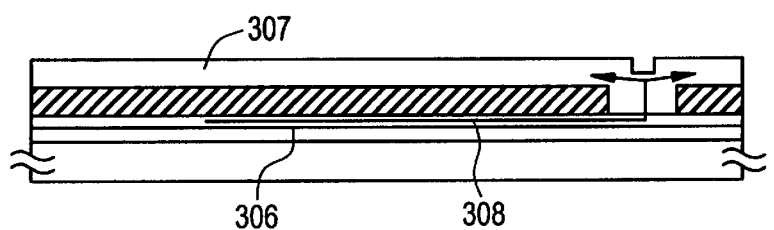

Then, an amorphous silicon film 307 heavily doped with phosphorus is formed to a thickness of 300 nm by plasma-assisted CVD (FIG. 3(D)). Subsequently, a heat treatment is performed at 600° C. for 8 hours. This getters nickel remaining in the crystalline silicon film 306 and drives the gettered nickel into the amorphous silicon film 307.

More specifically, the heat treatment causes the phosphorus present inside the amorphous silicon film 307 to accept the nickel existing in the silicon film 306. As a result, nickel existing in the crystalline silicon film 306 is absorbed into the amorphous silicon film 307 heavily doped with nickel. During this step, the amorphous silicon film 307 is crystallized without presenting problems.

Figure 3E:
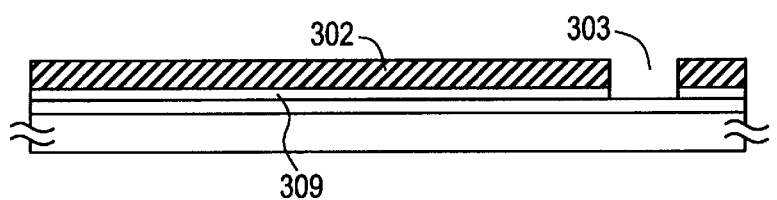

Then, the silicon film 307 is removed. The silicon film 306 is etched while using the mask 302 consisting of a film of silicon oxide. In this way, a silicon film pattern 309 is obtained as shown in FIG. 3(E).

Thereafter, an active layer pattern for a TFT is formed, using the laterally grown region in the silicon film pattern 309. This pattern corresponds to the region 107 shown in FIG. 1(E). Then, the process sequence is performed in the same way as in the steps starting with FIG. 2(A) of Example 1. Of course, other TFTs may be fabricated, using the laterally grown region. The configuration of Example 2 or 3 may be adopted, in addition to the configuration of Example 1.

EXAMPLE 6

The present example gives an example of manufacture of a bottom-gate TFT. The process sequence of the present example is illustrated in FIGS. 4(A)–4(D). First, a gate electrode 402 is formed on a glass substrate 401. in this example, no buffer layer is formed on the glass substrate (FIG. 4(A)).

It is necessary that the gate electrode 402 be made of a material capable of withstanding a heat treatment step carried out later. In this example, the gate electrode 402 is fabricated from tantalum to a thickness of 400 nm by sputtering (FIG. 4(A)).

Subsequently, a silicon oxide film 403 becoming a gate insulator film is formed to a thickness of 100 nm by plasma-assisted CVD. Then, an amorphous silicon film 404 is formed to a thickness of 50 nm by plasma-assisted CVD. Instead of the plasma-assisted CVD, LPCVD may be used.

Figure 4A:
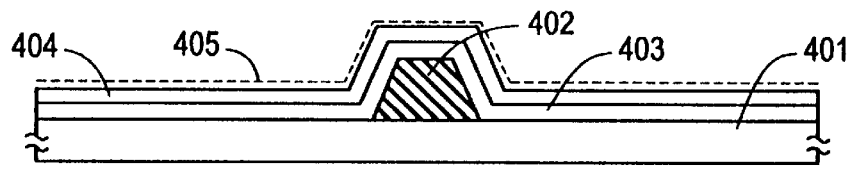
FIGS. 4(A)–4(D) are a cross-sectional view of a further TFT, illustrating a process sequence for fabricating the TFT in accordance with the invention.

A nickel acetate solution is applied to the whole surface of the exposed surface of the amorphous silicon film, so that nickel is kept in contact with the amorphous silicon film as indicated by 405 (FIG. 4(A)). In this example, nickel is introduced into the whole surface of the amorphous silicon film. Alternatively, nickel may be selectively introduced, using a mask as shown in FIGS. 3(B) and 3(C), and lateral growth is effected.

Figure 4B:
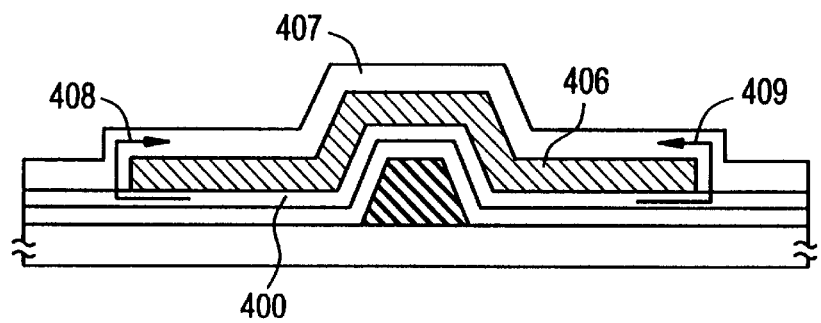
Figure 4C:
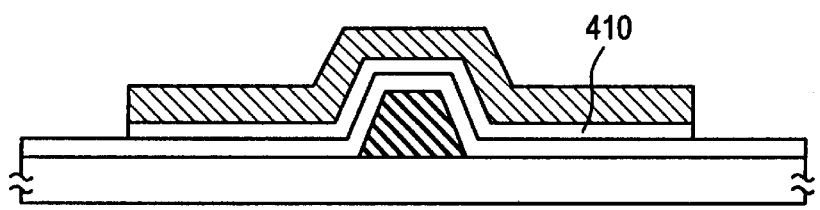
Figure 4D:
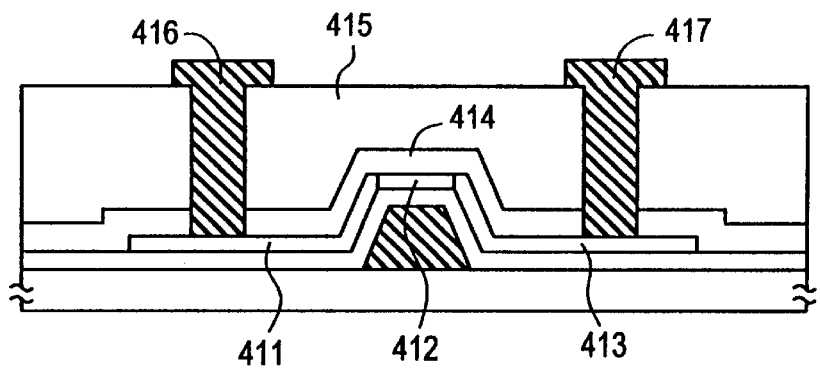

Then, a heat treatment is performed at 600° C. for 8 hours to crystallize the amorphous silicon film 404, thus obtaining a crystalline silicon film 400 (FIG. 4(B)). Subsequently, a mask 406 is fabricated from silicon oxide. In this specific example, a silicon oxide film (not shown) is formed to a thickness of 150 nm by plasma-assisted CVD. The silicon oxide film is then patterned to create a pattern indicated by 406.

An amorphous silicon film 407 heavily doped with phosphorus is then formed to a thickness of 200 nm by plasma-assisted CVD. In this specific example, the amorphous silicon film 407 is formed, using gaseous mixture consisting of 98% by volume of silane and 2% by volume of phosphine (FIG. 4(B)).

Then, a heat treatment is performed at 600° C. for 4 hours in a nitrogen ambient. During the process step, nickel diffused in the silicon film 400 moves into the amorphous silicon film 407 as indicated by 408 and 409 (FIG. 4(B)).

Subsequently, the amorphous silicon film 407 heavily doped with nickel is removed. Using a mask 406, the portions of the crystalline silicon film 400 not covered by the mask 406 are removed (FIG. 4(C)). In this way, a crystalline silicon film 410 patterned by the mask 406 is obtained (FIG. 4(C)). The concentration of nickel in the crystalline silicon film 410 is reduced to a minimum. Furthermore, high crystallinity is imparted to the silicon film 410 by the action of nickel. This crystalline silicon film will become an active layer for TFTs.

Then, the mask 406 consisting of the film of silicon oxide is removed. An implant mask (not shown) is placed, and phosphorus is selectively introduced into the active layer. As a result, phosphorus is lodged into regions 411 and 413. In the present example, an example of manufacture of an N-channel TFT is given. Where a P-channel TFT is fabricated, boron is introduced.

After the introduction of the dopant, laser annealing is carried out to activate the doped regions. In this manner, a source region 411, a channel region 412, and a drain region 413 are formed (FIG. 4(D)).

Then, a silicon nitride film 414 is formed as an interlayer dielectric film to a thickness of 300 nm by plasma-assisted CVD. Acrylic resin is spin-coated as an acrylic resin film 415. Besides acrylics, various resinous materials such as polyimide, polyamide, polyimidamide, and epoxies can be used.

After forming the interlayer dielectric film, a contact hole is created. A source electrode 416 and a drain electrode 417 are formed. In this way, a bottom-gate TFT is completed (FIG. 4(D)).

EXAMPLE 7

Figure 5:
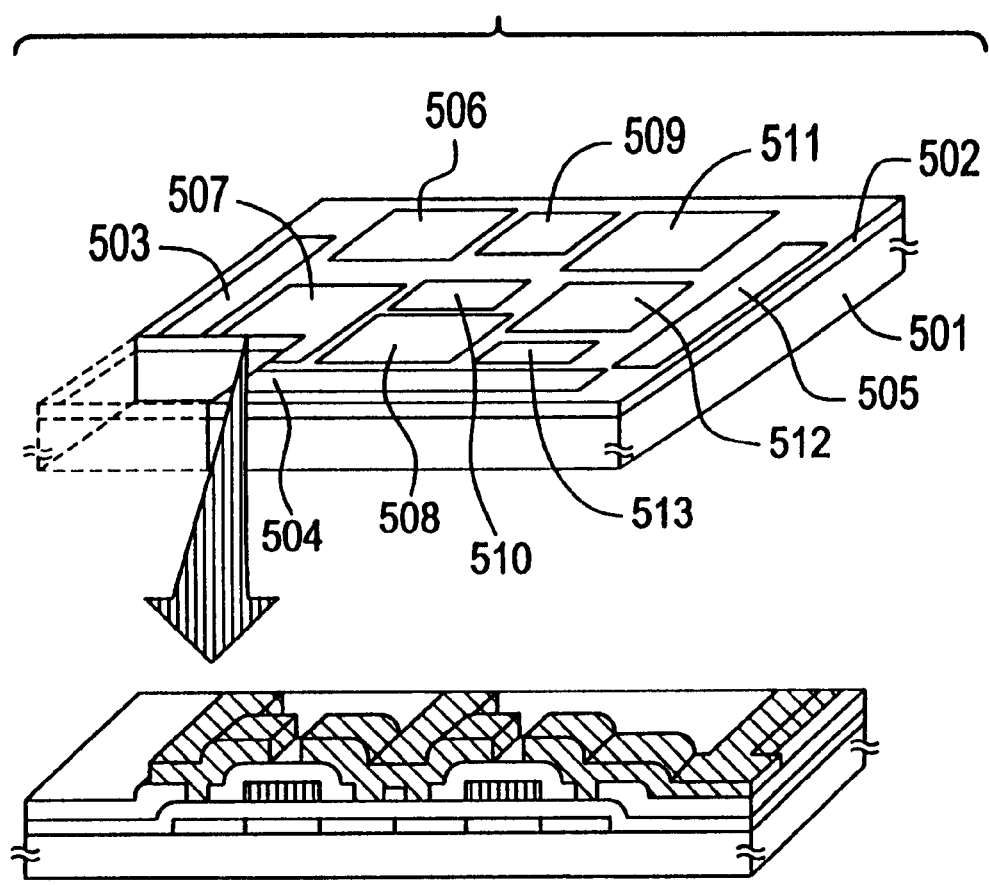
FIG. 5 is an exploded fragmentary perspective view of an integrated circuit using TFTs in accordance with the invention.

In the present example, various examples of apparatus or commercial products using TFTs are given. FIG. 5 shows an example of a microprocessor consisting of semiconductor circuits making use of TFTs. A part of FIG. 5 is also drawn to a larger scale, depicting complementary TFTs consisting of an N-type TFT and a p-type TFT.

A dielectric film 502 is formed on a ceramic base 501. Active components are electrically isolated from the base. I/O ports 503–505, a CPU 506, a cache memory 507, a cache address array 508, a multiplier 509, circuitry 510 including a real-time clock, a serial interface, and a timer, a clock control circuit 511, a cache controller 512, and a bus controller 513 are formed on the dielectric film.

EXAMPLE 8

The TFTs disclosed herein can be applied to various flat-panel displays and to intelligent terminals and video cameras equipped with such flat-panel displays. These devices and appliances are collectively referred to herein as solid-state devices. Examples of these solid-state devices are hereinafter described by referring to FIGS. 6(A)–6(F). The illustrated devices include TFTs.

Figure 6A:
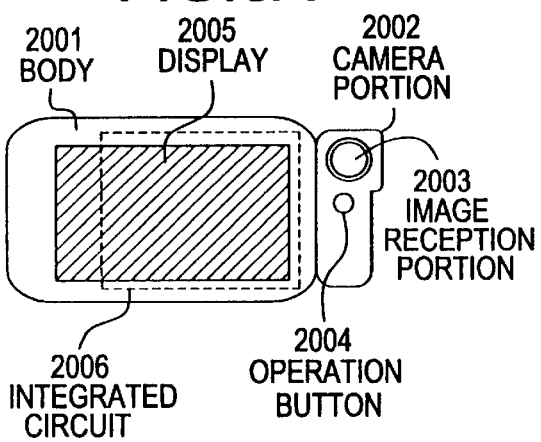
FIGS. 6(A)–6(F) are a view schematically showing various commercial products using TFTs in accordance with the invention.

Referring to FIG. 6(A), there is shown a portable intelligent terminal whose body is indicated by numeral 2001. The body 2001 has an active-matrix liquid crystal display or active-matrix EL display. In addition, the body has a camera portion 2002 for accepting information from the outside. An integrated circuit 2006 is incorporated inside the body. The camera portion 2002 has an image-reception portion 2003 and operation buttons 2004. It is considered that intelligent terminals will be made thinner and lighter to improve the portability. In this structure, the active-matrix display 2005 is formed on a substrate or base. Preferably, peripheral driver circuits, arithmetic circuits, and memories are fabricated as ICs from TFTs on the substrate.

Figure 6B:
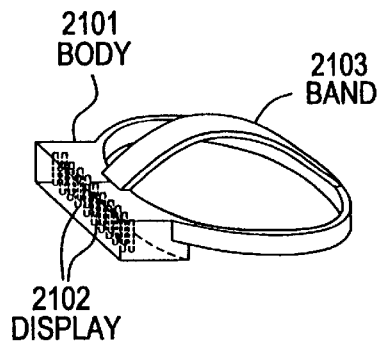

Referring next to FIG. 6(B), there is shown a head-mounted display (HMD). The body of this display is indicated by 2101 and equipped with an active-matrix liquid crystal display or an EL display 2102. The body 2101 can be held to the user's head with a band 2103.

Figure 6C:
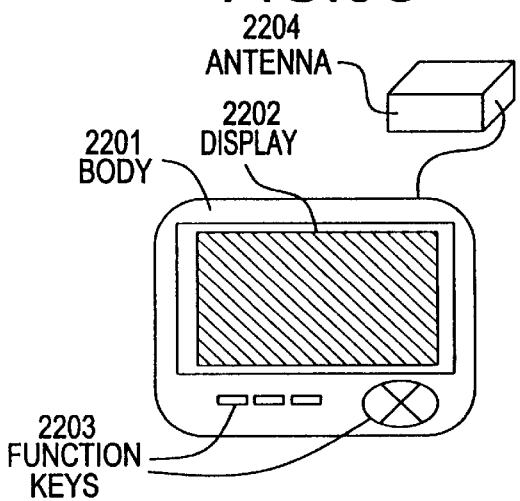

Referring next to FIG. 6(C), there is shown a car navigational system whose body is indicated by numeral 2201. The body 2201 is equipped with an active-matrix liquid crystal display 2202. This system has an antenna 2204 for receiving a signal from an artificial satellite. The signal produced from the antenna 2204 is sent to the active-matrix liquid crystal display 2202 to display geographical information. The display 2202 can be an EL display. In either case, the display is an active-matrix flat-panel display utilizing TFTs. The body 2201 is fitted with function keys 2203 to permit a user to perform various operations.

Figure 6D:
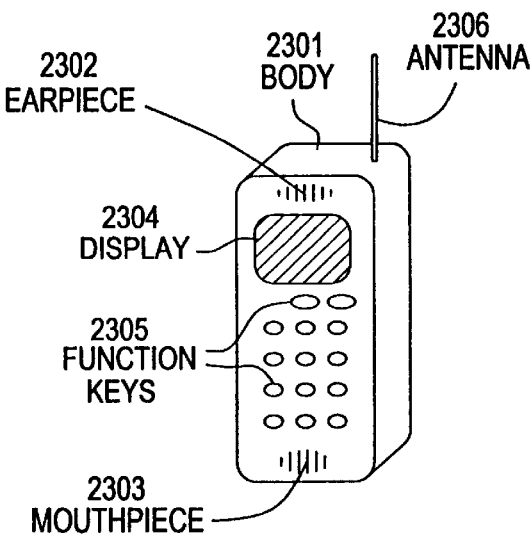

Referring next to FIG. 6(D), there is shown a cellular telephone whose body is indicated by 2301. The body 2301 has an active-matrix liquid crystal display 2304, numeric keypad and function keys 2305, a mouthpiece 2303, an earpiece 2302, and an antenna 2306.

In recent years, a commercial product that is a combination of the portable intelligent terminal shown in FIG. 6(A) and the cellular mobile telephone shown in FIG. 6(D) has been available.

Figure 6E:
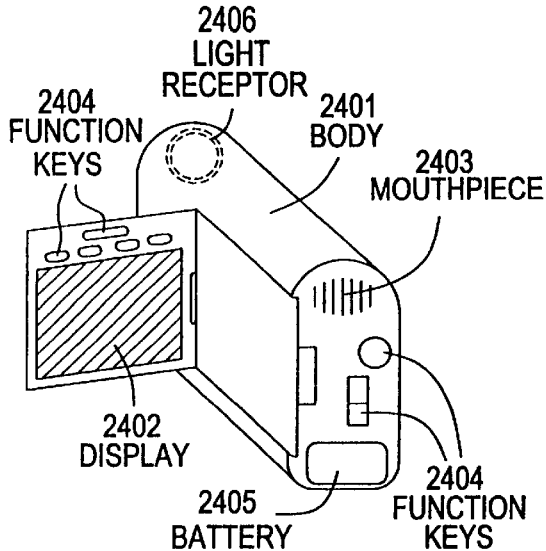

Referring next to FIG. 6(E), there is shown a portable video camera whose body is indicated by 2401. This body 2401 has light receptors 2406, a mouthpiece 2403, function keys 2404, an active-matrix liquid crystal display 2402, and a battery 2405.

Figure 6F:
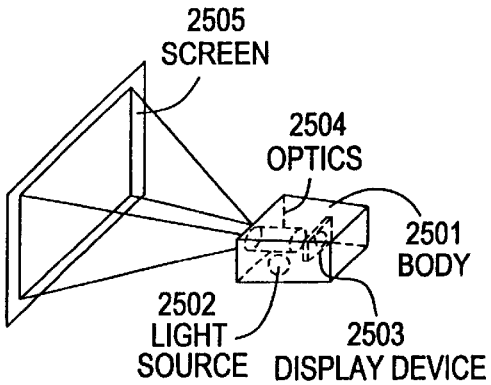

Referring next to FIG. 6(F), there is shown a front projector whose body is indicated by 2501. This body 2501 has a light source 2502, a display device 2503, and optics 2504. A screen 2505 is mounted in front of the body 2501. The invention can be applied to the display device 2503. In this example, the liquid crystal display 2503 is of the reflection type. The liquid crystal display may also be of the transmissive type, in which case the optics may be modified.

In many of the examples described above, the display consists of a liquid crystal display. An EL display may be used as the active-matrix display device.

The present invention can eliminate the effects of nickel remaining in a crystalline silicon film using a metal for promoting crystallization of silicon. That is, TFTs using a silicon film having high crystallinity can be manufactured. The effects of the metal on the TFTs can be decreased. In the invention, the use of a thin film for gettering the metal is adopted and so high throughput can be obtained relatively easily.

What is claimed is:

1. A method of fabricating a semiconductor device, comprising the steps of:
   forming a silicon film crystallized by the action of a metal for promoting crystallization of silicon;
   forming a mask for exposing a part of said silicon film;
   forming a film containing a XV group element so as to cover the exposed part of said silicon film and said mask; and
   performing a heat treatment to move said metal from said silicon film into said film containing the XV group element.

2. A method according to claim 1, wherein said metal for promoting crystallization of silicon is one or more elements selected from the group consisting of Fe, Co, Ni, Ru, Rh, Pd, Os, Ir, Pt, Cu, Au, Ge, Pb, and In.

3. A method according to claim 1, wherein P is used as said XV group element.

4. A method according to claim 1, wherein one element selected from the group consisting of P, As, and Sb is used as said XV group element.

5. A method according to claim 1, further comprising the step of irradiating the silicon film containing said XV group element with laser light or other intense light to activate phosphorus.

6. A method according to claim 1, wherein said heat treatment is performed with a resistively heating furnace.

7. A method according to claim 1, wherein said heat treatment is performed by irradiation of intense light.

8. A method according to claim 1, wherein nickel is used as said metal for promoting crystallization of silicon, and wherein phosphorus (P) is used as said XV group element.

9. A method according to claim 1, wherein said heat treatment to getter metal and to drive said metal from said silicon film into said film containing the XV group element is performed at 450–750° C.

10. A method of fabricating a semiconductor device, comprising the steps of:
    forming a silicon film crystallized by the action of a metal for promoting crystallization of silicon;
    forming a mask for exposing a part of said silicon film;
    forming a second film containing a XV group element so as to cover the exposed part of said silicon film and said mask; and
    performing a heat treatment to getter said metal and to drive said metal from said silicon film into said second film.

11. A method according to claim 10, wherein said metal for promoting crystallization of silicon is one or more elements selected from the group consisting of Fe, Co, Ni, Ru, Rh, Pd, Os, Ir, Pt, Cu, Au, Ge, Pb, and In.

12. A method according to claim 10, wherein P is used as said XV group element.

13. A method according to claim 10, wherein one element selected from the group consisting of P, As, and Sb is used as said XV group element.

14. A method according to claim 10, further comprising the step of irradiating the silicon film containing said XV group element with laser light or other intense light to activate phosphorus.

15. A method according to claim 10, wherein said heat treatment is performed with a resistively heating furnace.

16. A method according to claim 10, wherein said heat treatment is performed by irradiation of intense light.

17. A method according to claim 10, wherein nickel is used as said metal for promoting crystallization of silicon, and wherein phosphorus (P) is used as said XV group element.

18. A method according to claim 10, wherein said heat treatment to getter metal and to drive said metal from said silicon film into said film containing the XV group element is performed at 450–750° C.

19. A method of fabricating a semiconductor device, comprising the steps of:
    forming a mask on an amorphous silicon film and exposing a part of said amorphous silicon film;
    preparing a metal for promoting crystallization of silicon;
    selectively introducing said metal into the exposed part of said amorphous silicon film to form a metal-doped region;
    performing a heat treatment to diffuse said metal from said metal-doped region into said silicon film to form a metal-diffused silicon film;
    forming a silicon film containing a XV group element on said mask to bring said silicon film containing the XV group element into contact with said metal-diffused silicon film on the metal-doped region; and
    performing a heat treatment to move said metal from said metal-diffused silicon film into said film containing the XV group element via said metal-doped region.

20. A method according to claim 19, wherein said metal for promoting crystallization of silicon is one or more elements selected from the group consisting of Fe, Co, Ni, Ru, Rh, Pd, Os, Ir, Pt, Cu, Au, Ge, Pb, and In.

21. A method according to claim 19, wherein P is used as said XV group element.

22. A method according to claim 19, wherein one element selected from the group consisting of P, As, and Sb is used as said XV group element.

23. A method according to claim 19, further comprising the step of irradiating the silicon film containing said XV group element with laser light or other intense light to activate phosphorus.

24. A method according to claim 19, wherein said heat treatment is performed with a resistively heating furnace.

25. A method according to claim 19, wherein said heat treatment is performed by irradiation of intense light.

26. A method according to claim 19, wherein nickel is used as said metal for promoting crystallization of silicon, and wherein phosphorus (P) is used as said XV group element.

27. A method according to claim 19, wherein said heat treatment to getter metal and to drive said metal from said silicon film into said film containing the XV group element is performed at 450–750° C.

28. A method of fabricating a semiconductor device, comprising the steps of:

forming a mask on an amorphous silicon film and exposing a part of said amorphous silicon film;

preparing a metal for promoting crystallization of silicon;

selectively introducing said metal into the exposed part of said amorphous silicon film to form a metal-doped region;

performing a heat treatment to diffuse said metal from said introduced region into said silicon film to form a metal-diffused silicon film;

forming a silicon film containing a XV group element on said mask to bring said silicon film containing the IV group element into contact with said metal-diffused silicon film on the metal-doped region; and performing a heat treatment to getter and drive said metal from said metal-diffused silicon film into said film containing the XV group element via said metal-doped region.

29. A method according to claim 28, wherein said metal for promoting crystallization of silicon is one or more elements selected from the group consisting of Fe, Co, Ni, Ru, Rh, Pd, Os, Ir, Pt, Cu, Au, Ge, Pb, and In.

30. A method according to claim 28, wherein P is used as said XV group element.

31. A method according to claim 28, wherein one element selected from the group consisting of P, As, and Sb is used as said XV group element.

32. A method according to claim 28, further comprising the step of irradiating the silicon film containing said XV group element with laser light or other intense light to activate phosphorus.

33. A method according to claim 28, wherein said heat treatment is performed with a resistively heating furnace.

34. A method according to claim 28, wherein said heat treatment is performed by irradiation of intense light.

35. A method according to claim 28, wherein nickel is used as said metal for promoting crystallization of silicon, and wherein phosphorus (P) is used as said XV group element.

36. A method according to claim 28, wherein said heat treatment to getter metal and to drive said metal from said silicon film into said film containing the XV group element is performed at 450–750° C.

37. A method according to claim 1 wherein said semiconductor device is an EL display.

38. A method according to claim 10 wherein said semiconductor device is an EL display.

39. A method according to claim 19 wherein said semiconductor device is an EL display.

40. A method according to claim 28 wherein said semiconductor device is an EL display.

41. A method according to claim 1 wherein said semiconductor device is a portable intelligent terminal, a head-mount display, a car navigation system, a cellular telephone, a portable video camera or a front projector.

42. A method according to claim 10 wherein said semiconductor device is a portable intelligent terminal, a head-mount display, a car navigation system, a cellular telephone, a portable video camera or a front projector.

43. A method according to claim 19 wherein said semiconductor device is a portable intelligent terminal, a head-mount display, a car navigation system, a cellular telephone, a portable video camera or a front projector.

44. A method according to claim 28 wherein said semiconductor device is a portable intelligent terminal, a head-mount display, a car navigation system, a cellular telephone, a portable video camera or a front projector.

* * * * *